(12) United States Patent
Lee et al.

(10) Patent No.: US 9,190,143 B2
(45) Date of Patent: Nov. 17, 2015

(54) VARIABLE RESISTANCE MEMORY DEVICE AND RELATED METHOD OF OPERATION

(71) Applicant: SAMSUNG ELECTRONICS CO., LTD., Suwon-si, Gyeonggi-do (KR)

(72) Inventors: Cheon An Lee, Hwaseong-si (KR); Donghun Kwak, Hwaseong-si (KR); Ingyu Baek, Seoul (KR)

(73) Assignee: Samsung Electronics Co., Ltd., Suwons-si, Gyeonggi-do (KR)

( * ) Notice: Subject to any disclaimer, the term of this patent is extended or adjusted under 35 U.S.C. 154(b) by 416 days.

(21) Appl. No.: 13/693,093

(22) Filed: Dec. 4, 2012

(65) Prior Publication Data

US 2013/0215666 A1 Aug. 22, 2013

(30) Foreign Application Priority Data

Feb. 21, 2012 (KR) .................. 10-2012-0017407

(51) Int. Cl.
*G11C 11/00* (2006.01)
*G11C 13/00* (2006.01)

(52) U.S. Cl.
CPC ........ *G11C 13/0002* (2013.01); *G11C 13/0007* (2013.01); *G11C 2213/71* (2013.01); *G11C 2213/77* (2013.01)

(58) Field of Classification Search
CPC .......... G11C 13/0069; G11C 2213/71; G11C 13/0002; G11C 13/0004; G11C 13/0009; G11C 13/0097; G11C 2013/0054
USPC ............... 365/148, 163, 175, 189.09, 189.16, 365/230.06
See application file for complete search history.

(56) References Cited

U.S. PATENT DOCUMENTS

| | | | |
|---|---|---|---|
| 5,363,328 A | 11/1994 | Browning, III et al. | |
| 5,790,452 A | 8/1998 | Lien | |
| 6,795,329 B2 | 9/2004 | Jacob | |
| 6,870,755 B2 | 3/2005 | Rinerson et al. | |
| 7,881,095 B2 | 2/2011 | Lu et al. | |
| 7,903,450 B2 | 3/2011 | Chuang et al. | |
| 2008/0025072 A1 | 1/2008 | Tamai et al. | |
| 2009/0273964 A1* | 11/2009 | Yamazaki et al. | 365/148 |
| 2010/0080037 A1* | 4/2010 | Inoue et al. | 365/148 |
| 2011/0141801 A1 | 6/2011 | Gopalakrishnan | |

* cited by examiner

*Primary Examiner* — Gene Auduong
(74) *Attorney, Agent, or Firm* — Volentine & Whitt, PLLC

(57) ABSTRACT

A method of operating a variable resistance memory device comprises determining a level of an access voltage based on a number of rows or columns of a cell array, and supplying the access voltage having the determined level to the cell array.

20 Claims, 15 Drawing Sheets

Fig. 11

| | Program | Erase | Read |
|---|---|---|---|
| Selected WL | Vpgm<br>Vrst < Vpgm ≤ 2Vrst, or<br>Vrst < Vpgm ≤ -(m+n-1)\|Vset\| | 0 V | Vsen<br>-(m+n-1)\|Vrst\| ≤ Vsen < \|Vset\|<br>or<br>Vrst ≤ Vsen < (m+n-1)\|Vset\| |
| Unselected WL | Vinh | | Floating |
| Selected BL | GND | Vers,<br>Vers ≥ 2\|Vrst\| | GND |
| Unselected BL | Floating | | Floating |

VARIABLE RESISTANCE MEMORY DEVICE AND RELATED METHOD OF OPERATION

CROSS-REFERENCE TO RELATED APPLICATIONS

This application claims priority under 35 U.S.C. §119 to Korean Patent Application No. 10-2012-0017407 filed Feb. 21, 2012, the subject matter of which is hereby incorporated by reference.

BACKGROUND OF THE INVENTION

The inventive concept relates generally to electronic memory technologies. More particularly, the inventive concept relates to variable resistance memory devices and related methods of operation.

Semiconductor memory devices can be roughly divided into two categories according to whether they retain stored information when disconnected from power. These categories include volatile memory devices, which lose stored information when disconnected from power, and nonvolatile memory devices, which retain stored information when disconnected from power.

Among nonvolatile memory devices, flash memory has achieved popularity in recent years due to attractive features such as relatively high performance and storage capacity, relatively low cost and power consumption, and an ability to withstand physical shock. Nevertheless, there is a continuing demand for flash memory devices and other forms of nonvolatile memory having even greater integration density and storage capacity. Consequently, in an effort to address this demand, researchers are continually investigating new types of nonvolatile memory devices and improving existing nonvolatile memory devices.

Examples of nonvolatile memory that have been proposed as potential alternatives to flash memory include a ferroelectric random access memory (FRAM) using a ferroelectric capacitor, a magnetic RAM (MRAM) using a tunneling magneto-resistive (TRM) film, a phase change memory device using chalcogenide alloys, and a resistive RAM (RRAM) using a variable resistance material as a data storing medium.

In an RRAM, the variable resistance material film may exhibit reversible resistance variation according to a polarity or a magnitude of an applied electrical pulse. In general, a variable resistance element, such as the variable resistance material film, can be classified as a unipolar element or a bipolar element according to a polarity of a write pulse used to program it. In a unipolar variable resistance element, a polarity of a "set pulse" may be substantially identical to that of a "reset pulse". In a bipolar variable resistance element, a polarity of a set pulse may be opposite to that of a reset pulse.

RRAM is considered to have the potential for relatively high speed, data storage capacity, and other attractive performance characteristics. Accordingly, RRAM continues to be the subject of significant research and development.

SUMMARY OF THE INVENTION

According to one embodiment of the inventive concept, a method performed in relation to a variable resistance memory device comprising a cell array comprises determining a level of an access voltage based on a number of rows or columns of the cell array, and supplying the access voltage having the determined level to the cell array.

According to another embodiment of the inventive concept, a variable resistance memory device comprises a cell array comprising variable resistance memory cells arranged in m rows and n columns, wherein each variable resistance memory cell comprises a bipolar resistance memory material having an asymmetric hysteresis characteristic, and a voltage generator configured to provide the cell array with a driving voltage determined according to the number of rows and the number of columns.

According to another embodiment of the inventive concept, a variable resistance memory device comprises a cell array comprising variable resistance memory cells arranged in rows and columns connected to corresponding word lines and bit lines, wherein one or more of the variable resistance memory cells comprises a variable resistance storage element connected to a corresponding word line and a corresponding bit line without an intervening selection element.

These and other embodiments of the inventive concept can potentially eliminate a need for selection elements in variable resistance memory elements, which may simplify the design of variable resistance memory devices and may contribute to improved performance.

BRIEF DESCRIPTION OF THE DRAWINGS

The drawings illustrate selected embodiments of the inventive concept. In the drawings, like reference numbers indicate like features.

FIG. 11 is a table illustrating driving voltages of variable resistance memory cells according to an embodiment of the inventive concept.

DETAILED DESCRIPTION

Figure 1:
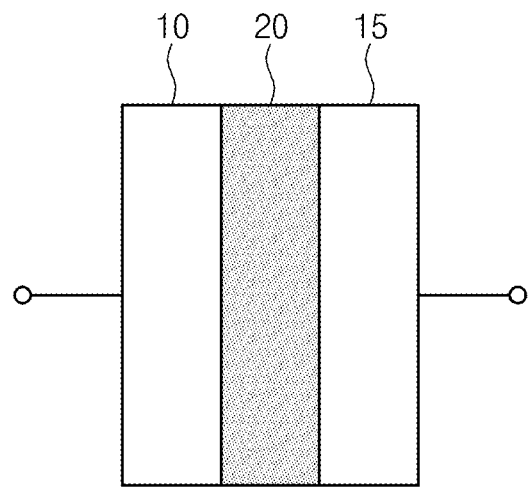
FIG. 1 is a diagram illustrating a variable resistance element according to an embodiment of the inventive concept.

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish between different features. Thus, a first feature could alternatively be termed a second feature and vice versa without changing the meaning of the relevant description.

Spatially relative terms, such as "beneath", "below", "lower", "under", "above", "upper" and the like, may be used herein for ease of description to describe one feature's relationship to another feature(s) as illustrated in the drawings. The spatially relative terms are intended to encompass different orientations of the device in use or operation in addition to the orientation depicted in the drawings. For example, if a device in the drawings is turned over, features described as "below" or "beneath" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing particular embodiments only and is not intended to limit the scope of the inventive concept. The singular forms "a", "an" and "the" are intended to encompass the plural forms as well, unless the context clearly indicates otherwise. The terms "comprises" and/or "comprising," where used in this specification, indicate the presence of stated features but do not preclude the presence or addition of one or more other features. As used herein, the term "and/or" indicates any and all combinations of one or more of the associated listed items.

Where a feature is referred to as being "on", "connected to", "coupled to", or "adjacent to" another feature, it may be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this description and should not be interpreted in an idealized or overly formal sense unless expressly so defined herein.

FIG. 1 is a diagram illustrating a variable resistance element according to an embodiment of the inventive concept. In certain embodiments described below, this variable resistance element can be used in a memory cell of a variable resistance memory device.

Referring to FIG. 1, the variable resistance element comprises a pair of electrodes 10 and 15 and a data storing film 20 interposed between electrodes 10 and 15. Electrodes 10 and 15 are typically formed of metal, metallic oxide, or metallic nitride. For example, they can be formed of Al, Cu, TiN, TixAlyNz, Ir, Pt, Ag, Au, polycrystalline silicon, W, Ti, Ta, TaN, WN, Ni, Co, Cr, Sb, Fe, Mo, Pd, Sn, Zr, Zn, IrO2, StZrO3, or the like.

Data storing film 20 can be formed of a bipolar resistance memory substance or a unipolar resistance memory substance. The bipolar resistance memory substance may be programmed to a set state being a low resistance state or a reset state being a high resistance state according to a polarity of a pulse of applied electricity, also referred to as a program pulse. The bipolar resistance memory substance typically comprises one or more materials in the Perovskite family such as PCMO ($PrCaMnO_3$) and Cr-STO ($SrTiO_3$). Using a Schottky Barrier Deformation principle, data storing film 20 may have different resistance values based on polarities of voltages applied to electrodes 10 and 15.

The variable resistance memory element may exhibit an asymmetric hysteresis characteristic according to a polarity and a level of a voltage across electrodes 10 and 15. Accordingly, where the polarity of the voltage across electrodes 10 and 15 is different, a current-voltage characteristic may differ. As a result, a cell array capable of being driven with a selection element may be implemented using the asymmetric hysteresis characteristic of the variable resistance memory element.

The structure of a variable resistance memory element is not limited to that illustrated in FIG. 1. In addition, a bipolar resistance memory element may be implemented by forming electrodes 10 and 15 with different materials.

Figure 2:
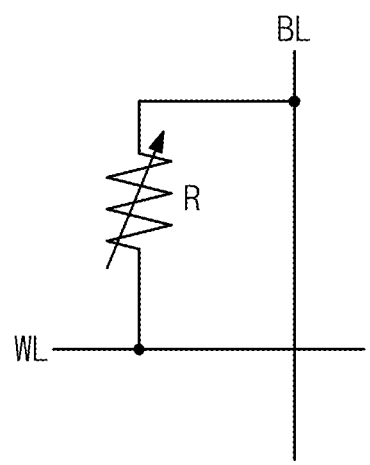
FIG. 2 is a circuit diagram illustrating a memory cell structure of a variable resistance memory device according to an embodiment of the inventive concept.

FIG. 2 is a circuit diagram illustrating a memory cell structure of a variable resistance memory device according to an embodiment of the inventive concept. The variable resistance memory cell comprises a variable resistance element R. For explanation purposes, it will be assumed that variable resistance element R has the structure illustrated in FIG. 1, although it is not limited to this structure.

A word line WL is electrically connected to first electrode 10 of variable resistance memory element R, and a bit line BL is electrically connected to second electrode 15 thereof. Programming, erasing, and sensing of a variable resistance memory cell is performed by applying various bias voltages to word line WL and bit line BL.

As illustrated in FIG. 2, the variable resistance memory cell may be modeled by a resistance element. A plurality of variable resistance memory cells can be formed in a cell array, and a fine bias voltage may be needed to select one of variable resistance memory cells in the cell array. In certain embodiments, fundamental bias conditions are provided to access a variable resistance memory cell not including a selection element.

Figure 3:
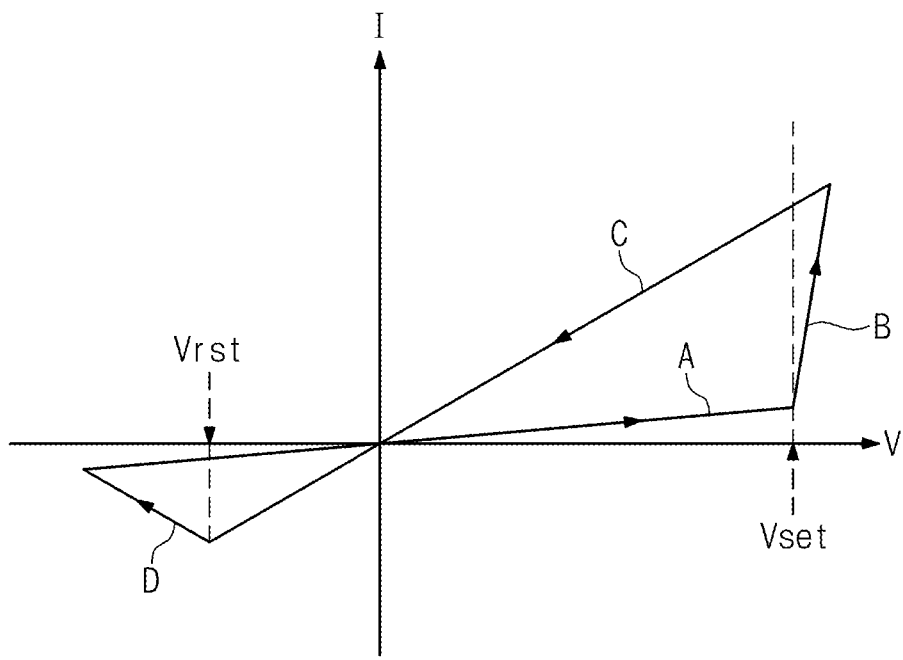
FIG. 3 is a graph illustrating an asymmetric hysteresis characteristic of a variable resistance memory cell according to an embodiment of the inventive concept.

FIG. 3 is a graph illustrating an asymmetric hysteresis characteristic of a variable resistance memory cell according to an embodiment of the inventive concept.

Referring to FIG. 3, the variable resistance memory cell exhibits different current-voltage characteristics in set and reset states. For explanation purposes, it will be assumed that a resistance value of the variable resistance memory cell is in a reset state being a high resistance state. As a voltage V across the variable resistance memory cell increases, a cell current I increases along a line A. Where voltage V reaches a set voltage Vset, a resistance value of the variable resistance memory cell may decrease rapidly. An initial high resistance state of the variable resistance memory cell transitions to a low resistance state where voltage V rises above set voltage Vset. Cell current I may increase rapidly along a line B.

However, a resistance state of the variable resistance memory cell may be stabilized at a specific level (e.g., about 1.0V).

Where programming to a set state is completed, a voltage applied to the variable resistance memory cell may decrease. Under these circumstances, a current-voltage characteristic may vary along a line C. Because the variable resistance memory cell is fixed to the set state being a low resistance state, cell current I may decrease along a line C where applied voltage V is lowered. This characteristic may be maintained even at a zero point where a polarity of the applied voltage V is changed. That is, although an inverted polarity of a voltage is applied to the variable resistance memory cell, the resistance value of the set state may be retained.

However, where a voltage across the variable resistance memory cell reaches a reset voltage Vrst, a resistance value of the variable resistance memory cell may increase rapidly. Thus, an absolute value of the cell current may decrease. Additionally, the variable resistance memory cell may be programmed to a high resistance state around reset voltage Vrst. This is illustrated by a line D. As a result, the variable resistance memory cell may maintain a reset state being a high resistance state at lines D and A, and may maintain a set state being a low resistance state at lines B and C.

In the hysteresis characteristic described in relation to FIG. 3, a current-voltage characteristic of the variable resistance memory cell is asymmetric with respect to the reset state and the set state. That is, an absolute value of a set voltage Vset for transition of a resistance value into a set state may be different from that of a reset voltage Vrst for transition into a reset state. In certain embodiments, this characteristic can be used to implement a variable resistance memory cell without a selection element.

In the description that follows, an operation for switching a low resistance state (e.g., a set state) of a variable resistance memory cell into a high resistance state (e.g., a reset state) may be referred to as a program operation, and an operation for switching a high resistance state (e.g., a reset state) of a variable resistance memory cell into a low resistance state (e.g., a set state) may be referred to as an erase operation.

Figure 4:
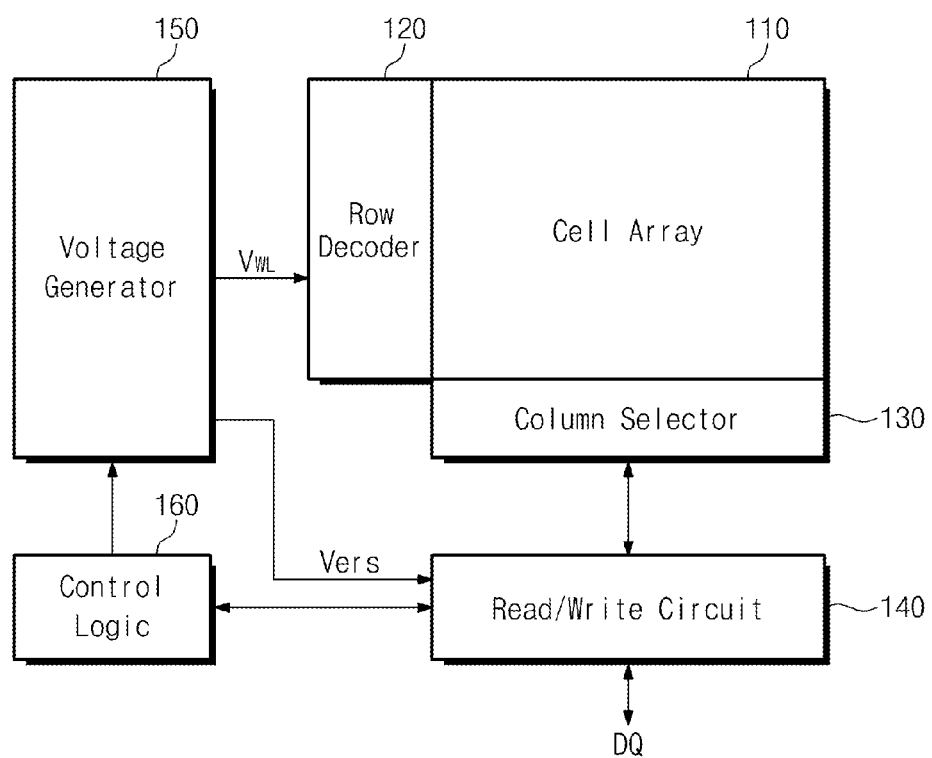
FIG. 4 is a block diagram illustrating a variable resistance memory device according to an embodiment of the inventive concept.

FIG. 4 is a block diagram illustrating a variable resistance memory device according to an embodiment of the inventive concept.

Referring to FIG. 4, a variable resistance memory device 100 comprises a cell array 110, a row decoder 120, a column selector 130, a read/write circuit 140, a voltage generator 150, and control logic 160. An operation for sensing whether a memory cell is at a reset state or at a set state is referred to as a read operation.

Cell array 110 typically comprises a plurality of variable resistance memory cells formed with the structure illustrated in FIG. 2. A variable resistance element in a memory cell is typically biased for access via a word line WL and a bit line BL. For explanation purposes, it is assumed that a program voltage Vpgm and a sensing voltage Vsen are applied to a memory cell via a word line WL. However, the inventive concept is not limited to these conditions. For example, program voltage Vpgm or sensing voltage Vsen may be applied to a memory cell via a bit line BL.

Cell array 110 is formed with m rows and n columns for storing of data. A program voltage Vpgm or a sensing voltage Vsen determined according to the number of rows and columns is provided to memory cells of cell array 110. In a program operation, program voltage Vpgm is applied to a word line of selected memory cells, and an inhibition voltage Vinh is applied to a word line of unselected memory cells. Inhibition voltage Vinh is typically half of program voltage Vpgm.

Row decoder 120 decodes a row address to select one of the word lines of cell array 110. Row decoder 120 provides a selected word line with a word line voltage $V_{WL}$ from voltage generator 150. In a program operation, row decoder 120 provides unselected word lines with inhibition voltage Vinh to block a leakage current.

Column selector 130 selects at least one bit lines based on a column address. The bit line selected by column selector 130 is connected to read/write circuit 140.

Read/write circuit 140 provides a bit line bias for accessing a selected memory cell under the control of control logic 150. Read/write circuit 140 provides a bit line voltage to write input data in cell array 110 and to sense data written in cell array 110. In an erase operation, read/write circuit 140 provides an erase voltage Vers to a bit line. Erase voltage Vers may be greater than or equal to twice an absolute value of reset voltage Vrst.

Voltage generator 150 generates voltages for programming, reading, and erasing of variable resistance memory device 100. Voltage generator 150 transfers the voltages to word line WL or bit line BL. Read/write circuit 140 generates program voltage Vpgm, inhibition voltage Vinh, and sensing voltage Vsen having at least one or more levels.

Program voltage Vpgm and sensing voltage Vsen can be determined according to the number of rows (m) and the number of columns (n). For example, program voltage Vpgm provided to a selected word line may be greater than or equal to a voltage corresponding to multiplication of set voltage Vset and (−(m+n−1)) and lower than reset voltage Vrst. Alternatively, program voltage Vpgm provided to a selected word line may be greater than or equal to twice reset voltage Vrst and lower than reset voltage Vrst. Reset voltage Vrst may be a negative voltage. In an erase operation, 0V is applied to all word lines in a selected memory block, and an erase voltage Vers is applied to bit lines. Erase voltage Vers is typically greater than or equal to twice reset voltage Vrst. In a read operation, sensing voltage Vsen is applied to selected word line WL. Sensing voltage Vsen can be determined according to the number of rows (m) and the number of columns (n) and be between reset voltage Vrst and set voltage Vset.

Control logic 160 performs programming, erasing, or sensing on a selected memory cell in response to a command CMD from an external device. Control logic 160 controls read/write circuit 140 and voltage generator 150 to access the selected memory cell.

Variable resistance memory device 100 provides program voltage Vpgm, erase voltage Vers, and sensing voltage Vsen for a selected memory cell according to the number of rows and the number of columns. Thus, where memory cells are formed without a selection element, leakage current flowing to unselected memory cells may be reduced, and unintended programming and erasing may be prevented.

Figure 5:
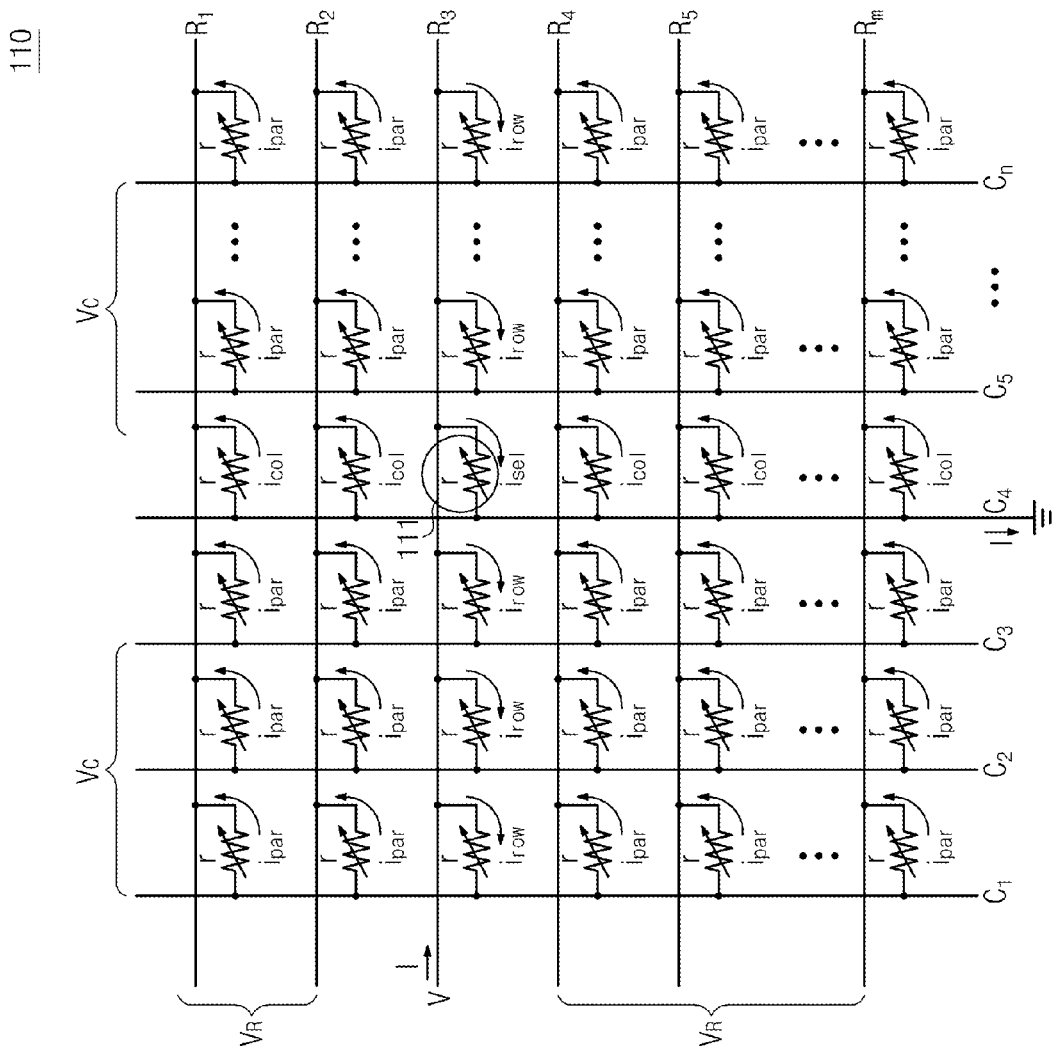
FIG. 5 is a circuit diagram illustrating a cell array in the variable resistance memory device of FIG. 4.

FIG. 5 is a circuit diagram illustrating cell array 110 of FIG. 4 according to an embodiment of the inventive concept.

Referring to FIG. 5, cell array 110 comprises m rows and n columns. It is assumed that a memory cell in a third row and a fourth column is selected. It is further assumed that a voltage V and a current I are applied to a word line corresponding to a selected row R3. It is still further assumed that word lines corresponding to unselected rows and bit lines corresponding to unselected columns are floated. Also, it is assumed that cell resistance values (τ) of all memory cells are equal to one another.

Under the above-described assumptions, a selection cell current $i_{sel}$ flows in a selected memory cell 111 along a direction that is illustrated in FIG. 3. A non-selected cell current $i_{row}$ flows in memory cells arranged at intersections of selected row R3 and unselected columns C1, C2, C3, and C5 to Cn. Non-selected cell current $i_{col}$ of a reverse direction flows in memory cells arranged at intersections of selected column C4 and unselected rows R1, R2, and R4 to Rm. Further, a parasitic current $i_{par}$ flows in memory cells arranged at intersections of unselected rows and unselected columns.

With Kirchhoffs Current Law to each row and each column, word line voltages $V_R$ corresponding to unselected rows R1, R2, and R4 to Rm have substantially the same magnitude. Also, bit line voltages $V_c$ of unselected columns C1, C2, C3, and C5 to Cn have the same magnitude. Results obtained by applying the Kirchhoff's Current Law to each row and each column may be expressed by the following equations (1-1), (1-2), and (1-3).

$$I = \frac{V}{r} E \left( \frac{mEn}{m+n+1} \right) \quad (1-1)$$
$$= \frac{V}{r} + \frac{(m-1)(n-1)}{m+n-1} E \frac{V}{r}$$

$$V_C = \frac{nV}{m+n-1} \quad (1-2)$$

$$V_R = \frac{(n-1)V}{m+n-1} \quad (1-3)$$

In addition to equations (1-1) through (1-3), currents $i_{sel}$, $i_{col}$, $i_{row}$, and $i_{par}$ flowing in memory cells each having a resistance value r may be expressed by the following equations (2-1) to (2-4).

$$i_{sel} = \frac{V}{r} \quad (2-1)$$

$$i_{row} = \frac{(V-V_C)}{r} = \frac{(m-1)}{m+n-1} E \frac{V}{r} \quad (2-2)$$

$$i_{col} = \frac{V_R}{r} = \frac{(n-1)}{m+n-1} E \frac{V}{r} \quad (2-3)$$

$$i_{par} = \frac{(V_C - V_R)}{r} = \frac{1}{m+n-1} E \frac{V}{r} \quad (2-4)$$

Program voltage Vpgm, inhibition voltage Vinh, erase voltage Vers, and sensing voltage Vsen of cell array 110 can be selected according to the equations (2-1) to (2-4).

Figure 6:
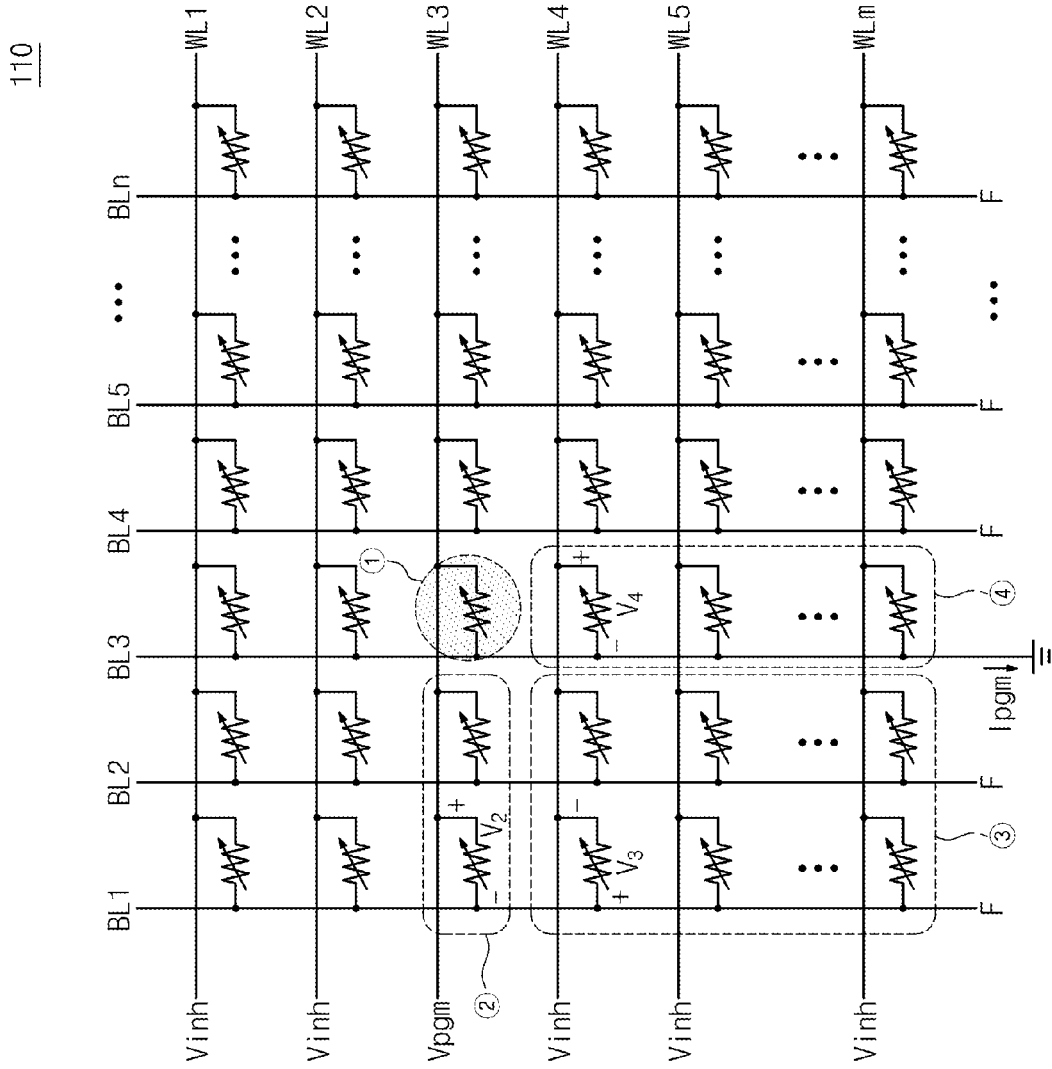
FIG. 6 is a circuit diagram illustrating bias conditions of a cell array in a program operation according to an embodiment of the inventive concept.

FIG. 6 is a circuit diagram illustrating bias conditions of cell array 110 in a program operation according to an embodiment of the inventive concept.

Referring to FIG. 6, program voltage Vpgm is applied to a selected word line, and inhibition voltage Vinh is applied to unselected word lines. In this example, inhibition voltage Vinh is half of program voltage Vpgm.

It is assumed that a word line WL3 is selected and a bit line BL3 is selected. Under theses assumptions, program voltage Vpgm is applied to a selected memory cell ①. Disturbance voltages of memory cells ②, ③, ④ can be expressed by the following equations (3-1) to (3-3). Memory cells ② may be unselected memory cells connected to the selected word line WL3, memory cells ③ may be connected to unselected word lines and unselected bit lines, and memory cells ④ may be connected to a selected bit line BL3 and unselected word lines.

$$V_2 = \frac{1}{2} EVpgm \quad (3-1)$$

$$V_3 = \frac{(m-1)}{2m} EVpgm \quad (3-2)$$

$$V_4 = -\frac{1}{2m} EVpgm \quad (3-3)$$

Equations (3-1) to (3-3) can be obtained from the equations (2-1) to (2-4) under the condition that an inhibition voltage Vinh is Vpgm/2. Under this condition, a program voltage Vpgm may be expressed by the following equation (4).

$$2EVrst(VpgmDVrst) \text{ or } -(m+n-1)EVrst(VpgmDVrst) \quad (4)$$

In equation (4), Vrst is a negative voltage.

With program voltage Vpgm defined by the equation (4), a disturbance voltage V2 applied to unselected memory cells ② connected with the selected word line WL3 is greater than Vrst or −0.5(m+n−1)×Vset and less than 0.5Vrst. Thus, memory cells may not be programmed to a reset state (or, a high resistance state) by disturbance voltage V2 applied to the unselected memory cells ②.

A disturbance voltage V3 applied to memory cells ③ connected with unselected word lines and unselected bit lines may correspond to a voltage of (m−1)/2m×Vpgm. Thus, a range of disturbance voltage V3 may be decided by multiplying (m−1)/2m to the equation (4). The value of (m−1)/2m may converge into −0.5 no matter how many the number of rows (m) increases. As a result, disturbance voltage V3 may be similar to disturbance voltage V2 in an absolute value. Memory cells ③ may not be erased to a set state because disturbance voltage V3 is less than set voltage Vset.

A disturbance voltage V4 applied to memory cells ④ connected with selected bit line BL3 and unselected word lines may correspond to a voltage of −½m×Vpgm. Thus, a range of disturbance voltage V4 may be determined by multiplying −½m by equation (4). The value of −½m may be −0.5 where the number of rows (m) is '1', and may converge into '0' as the number of rows (m) increases to infinity. As a result, the maximum value of disturbance voltage V4 may merely be half a disturbance voltage V2. Thus, the memory cells ④ may not be programmed to a reset state since disturbance voltage V4 is lower than a reset voltage Vrst.

Figure 7:
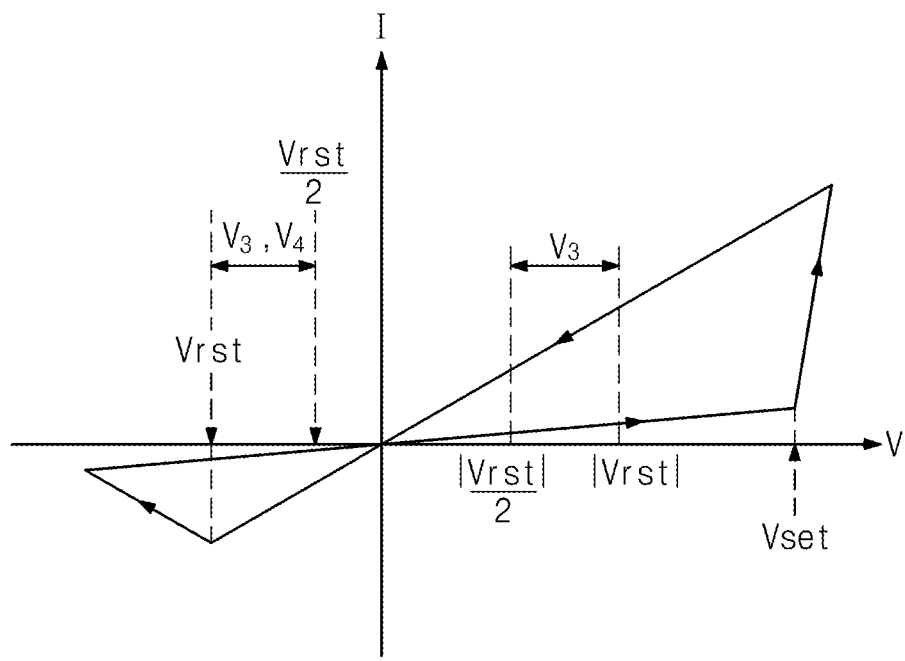
FIG. 7 is a diagram illustrating magnitudes of disturbance voltages described in relation to FIG. 6.

FIG. 7 is a diagram illustrating magnitudes of disturbance voltages described in FIG. 6.

Referring to FIG. 7, the diagram shows ranges of disturbance voltages V2, V3, and V4 applied to unselected memory cells (②, ③, ④) under a program voltage condition of the above-described equation (4). Values of disturbance voltages V2, V3, and V4 indicate ranges of voltages applied to unselected memory cells under the program voltage condition of equation (4). Disturbance voltages V2 and V4 applied to unselected memory cells ②, ④ may not exceed an absolute value of a reset voltage Vrst even at the worst case. Thus, unselected memory cells ②, ④ maintain a current resistance state stably at the condition of equation (4). Disturbance voltage V3 applied to unselected memory cells ③ does not exceed an absolute value of set voltage Vset even in a worst case. Thus, unselected memory cells ③ may maintain a stable state in the program operation.

Figure 8:
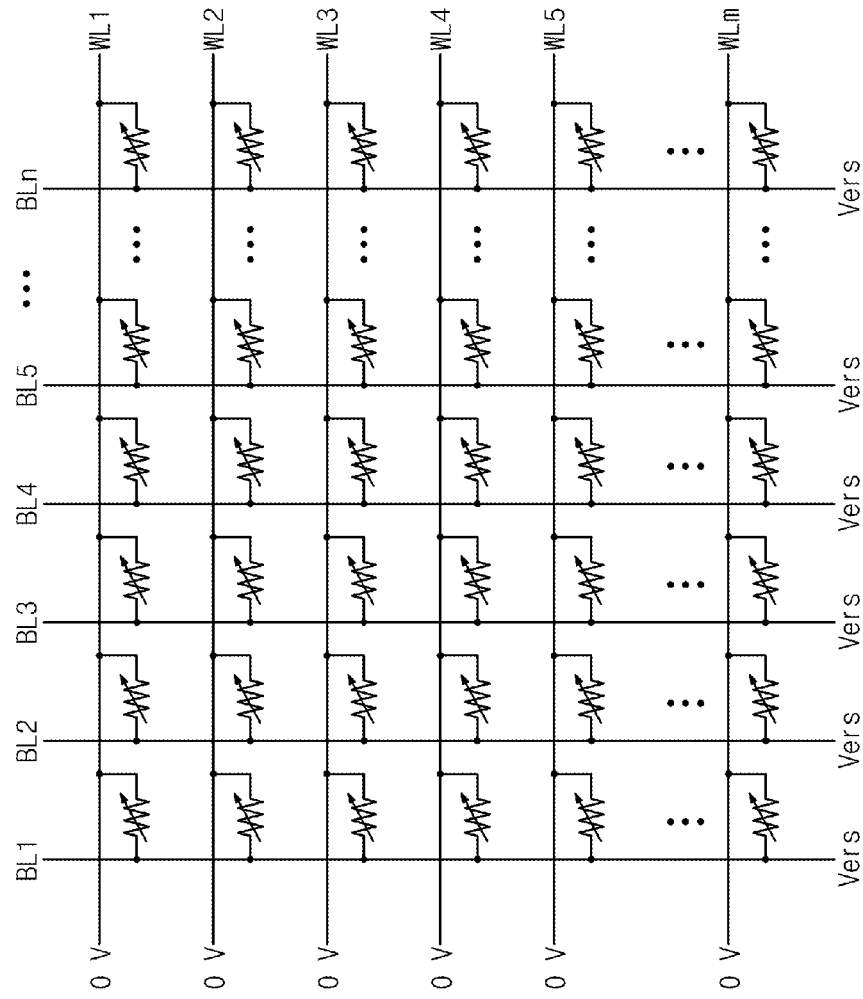
FIG. 8 is a circuit diagram illustrating bias conditions of a cell array in an erase operation according to an embodiment of the inventive concept.

FIG. 8 is a circuit diagram illustrating bias conditions of cell array 110 in an erase operation according to an embodiment of the inventive concept.

Referring to FIG. 8, memory cells are erased by block. A voltage of 0V is applied to all word lines WL1 to WLm to erase all memory cells in a selected block (i.e., for switching into a set state). At the same time, erase voltage Vers is applied to all bit lines BL1 to BLn of the selected block. Erase voltage Vers is greater than twice an absolute value of a reset voltage Vrst (2×|Vrst|).

Because memory cells are erased by the block, no disturbance between memory cells is generated during the erase operation. Thus, the erase operation may be performed stably and rapidly.

Figure 9:
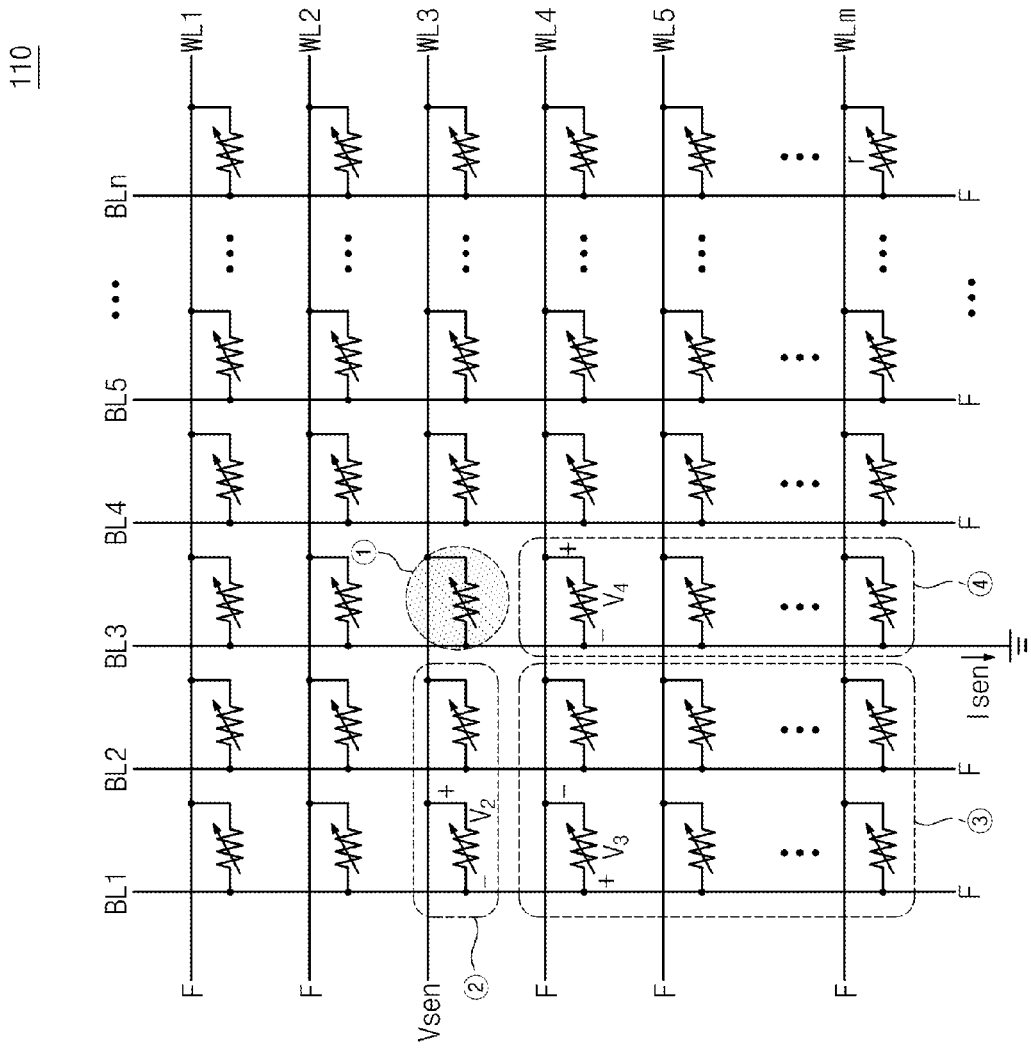
FIG. 9 is a circuit diagram illustrating bias conditions of a cell array in a read operation according to an embodiment of the inventive concept.

FIG. 9 is a circuit diagram illustrating bias conditions of cell array 110 in a read operation according to an embodiment of the inventive concept.

Referring to FIG. 9, sensing voltage Vsen is applied to a selected word line, and a selected bit line is grounded. Unselected word lines and unselected bit lines are floated. It is assumed that word line WL3 is selected and bit line BL3 is selected. Under these conditions, sensing voltage Vsen is applied across selected memory cell ①. Where sensing voltage Vsen is applied across selected memory cell ①, unintended disturbance voltages V2, V3, and V4 may be induced on unselected memory cells ②, ③, ④, which may cause read disturbance.

Disturbance voltages on unselected memory cells ②, ③, ④ may be expressed by the following equations. Memory cells ② may be unselected memory cells connected to the selected word line WL3, memory cells ③ may be connected to unselected word lines and unselected bit lines, and the memory cells ④ may be connected to selected bit line BL3 and unselected word lines.

$$V_2 = \frac{(m-1)}{(m+n-1)} EVsen \quad (5\text{-}1)$$

$$V_3 = \frac{1}{(m+n-1)} EVsen \quad (5\text{-}2)$$

$$V_4 = \frac{(n-1)}{(m+n-1)} EVsen \quad (5\text{-}3)$$

According to equations (5-1) to (5-3), disturbance voltages V2 and V4 on unselected memory cells ② and ④ are always lower than sensing voltage Vsen. Although sensing voltage Vsen is between a reset voltage Vrst and a set voltage Vset, unselected memory cells ② and ④ may not be erased or programmed. Nevertheless, disturbance voltage V3 forced to the unselected memory cells ③ may be a reverse direction of sensing voltage Vsen. Thus, it is necessary to prevent disturbance voltage V3 from changing to a voltage below reset voltage Vrst and from going to a voltage over set voltage Vset.

A range of sensing voltage Vsen satisfying the above-described condition may be determined such that sensing voltage Vsen is between set voltage Vset and reset voltage Vrst and satisfies a condition of −(m+n−1)|Vrst|≤Vsen<Vset or Vrst≤Vsen<(m+n−1)|Vset|.

Figure 10:
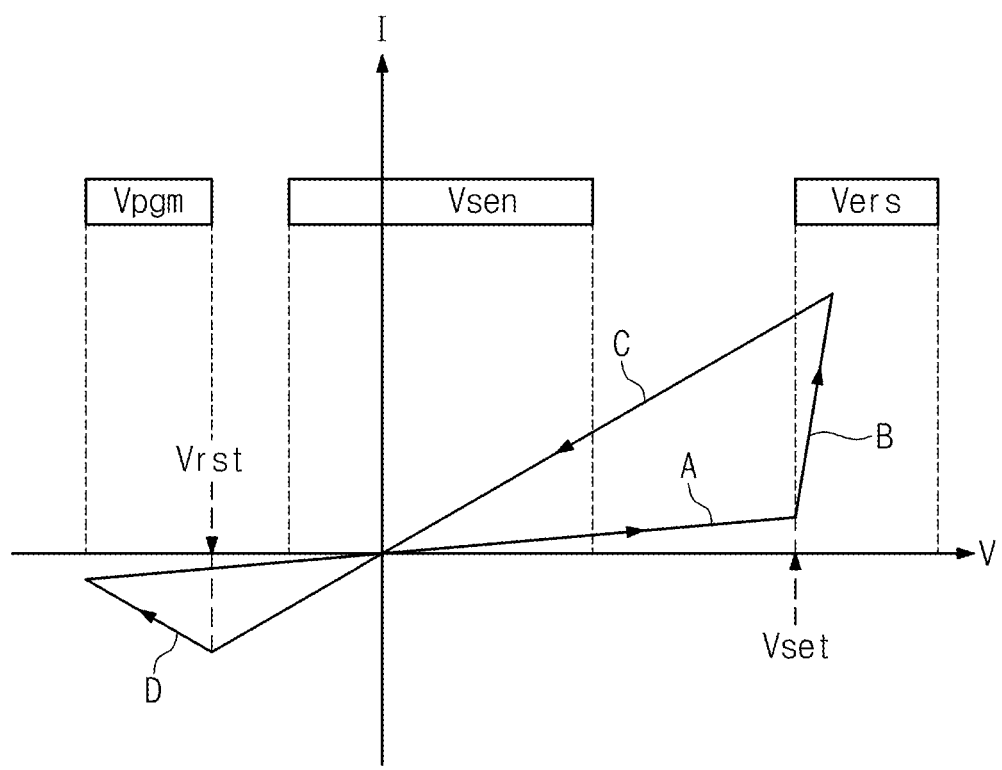
FIG. 10 is a diagram illustrating driving voltages of variable resistance memory cells according to an embodiment of the inventive concept.

FIG. 10 is a diagram illustrating driving voltages of variable resistance memory cells according to an embodiment of the inventive concept.

Referring to FIG. 10, the diagram shows ranges of program, erase, and sensing voltages Vpgm, Vers, and Vsen. Driving voltages Vpgm, Vers, and Vsen are typically provided within ranges illustrated in FIG. 10 although they vary finely according to the number of rows and the number of columns.

Although the above-described equation (4) is applied to program voltage Vpgm, program voltage Vpgm may be set below a reset voltage Vrst. Erase voltage Vers may be over twice an absolute value of a reset voltage Vrst and higher than a set voltage Vset at which a variable resistance material of a memory cell start to be switched into a set state. sensing voltage Vsen is determined such that it is between set voltage Vset and reset voltage Vrst and satisfies a condition of −(m+n−1)|Vrst|≤Vsen<Vset or Vrst≤Vsen<(m+n−1)|Vset|.

FIG. 11 is a table illustrating driving voltages of variable resistance memory cells according to an embodiment of the inventive concept.

Referring to FIG. 11, the table illustrates bias conditions of word lines and bit lines during erasing, programming, and reading.

During programming, program voltage Vpgm is applied to a selected word line, and an inhibition voltage Vinh is applied to unselected word lines. A ground voltage GND is applied to a selected bit line, and unselected bit lines is floated.

During erasing, a voltage of 0V is applied to all word lines of a selected memory block. At the same time, erase voltage Vers is applied to all bit lines of the selected memory block. Herein, erase voltage Vers is higher than a voltage of 2×|Vrst| at a minimum. Further, erase voltage Vers must be over a set voltage Vset at which resistance state is changed into a set state.

During reading, sensing voltage Vsen is applied to a selected word line, and a ground voltage GND is applied to a selected bit line. Unselected word lines and unselected bit lines are floated. Herein, sensing voltage Vsen is determined such that it is between set voltage Vset and reset voltage Vrst and satisfies a condition of −(m+n−1)|Vrst|≤Vsen<Vset or Vrst≤Vsen<(m+n−1)|Vset|.

Figure 12:
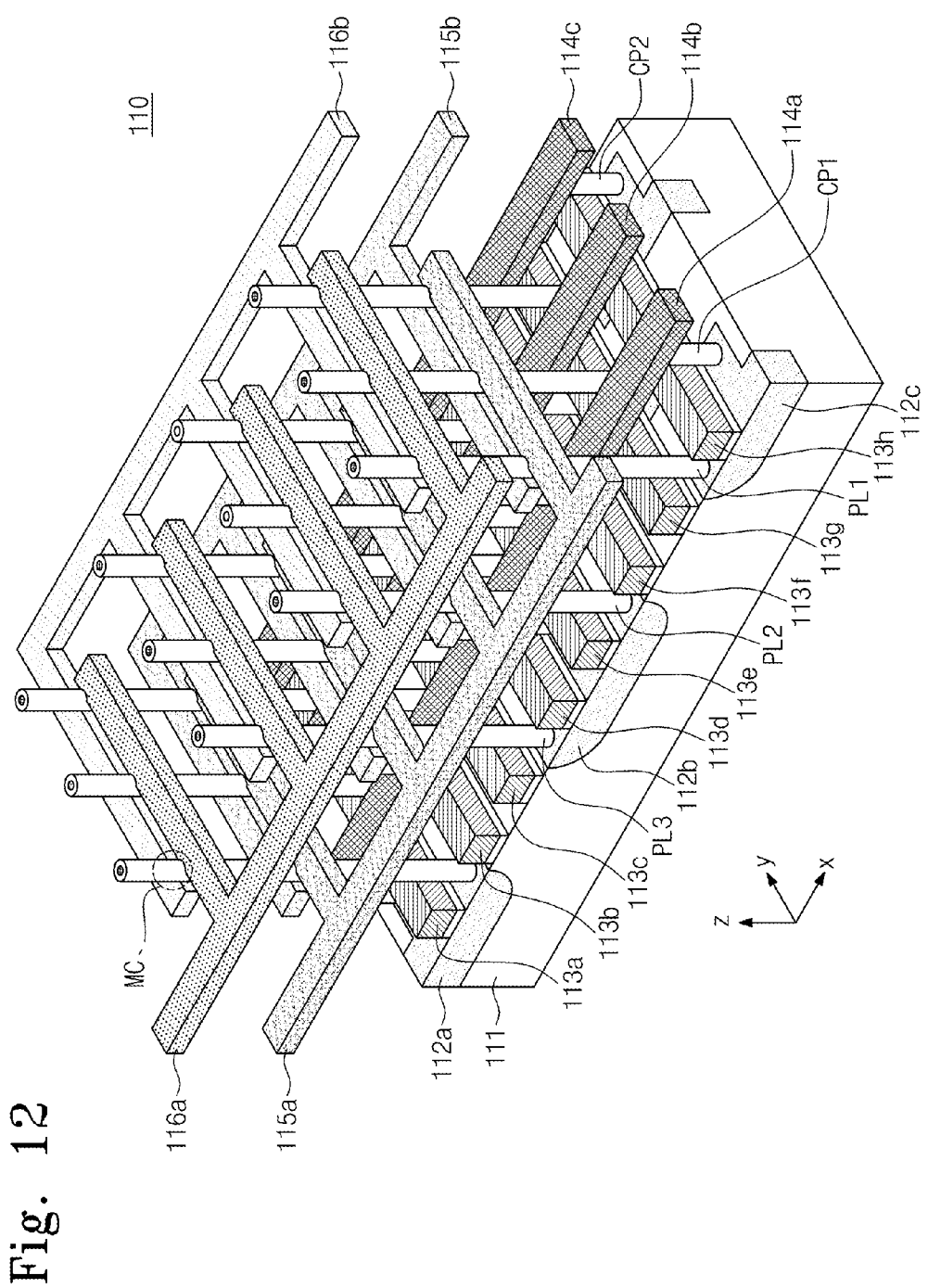
FIG. 12 is a perspective view illustrating a three-dimensional structure of a memory cell array in the variable resistance memory device of FIG. 4.

FIG. 12 is a perspective view illustrating a three-dimensional structure of memory cell array 110 according to an embodiment of the inventive concept.

Referring to FIG. 12, memory cell array 110 comprises structures extending along multiple directions x, y, and z. Memory cell array 110 is formed on a substrate 111. For example, substrate 111 may be formed of a p-well injected with an element such as boron. Alternatively, substrate 111 may be a pocket p-well provided within an n-well. Hereinafter, it is assumed that substrate 111 is a p-well. However, substrate 111 is not limited thereto.

Multiple doping regions 112*a* to 112*c* are formed at substrate 111. Doping regions 112*a* to 112*c* may be formed of an n-type conductor different from substrate 111, for example. However, the inventive concept is not limited thereto. Doping regions 112*a* to 112*c* are formed sequentially in the x-axis direction. This structure may be iterated in the y-axis direction. Word lines 113*a* to 113*h* connected to metal lines formed at multiple layers are formed over doping regions 112*a* to 112*c* to be electrically isolated from doping regions 112*a* to 112*c*.

Doping regions 112*a* to 112*c* are connected by contact plugs CP1 and CP2 to bit lines 114*a* to 114*c* extending in the x-axis direction. Doping regions 112*a* to 112*c* are connected with bit lines 114*a* to 114*c* and vertical electrodes of multiple pillars PL1 to PL4. That is, bit lines are connected to vertical electrodes of pillars PL1 to PL4 by doping regions 112*a* to 112*c*. Each of pillars PL1 to PL4 is connected with metal lines 115*a*, 115*b*, 116*a*, and 116*b* stacked at multiple layers. Metal lines 115*a* and 115*b* are also connected to a global word line.

Although memory cell array 110 may be formed with a three-dimensional structure as illustrated in FIG. 11, the inventive concept is not limited to this configuration. For instance, resistive memory cells can be stacked in various alternative manners.

Figure 13:
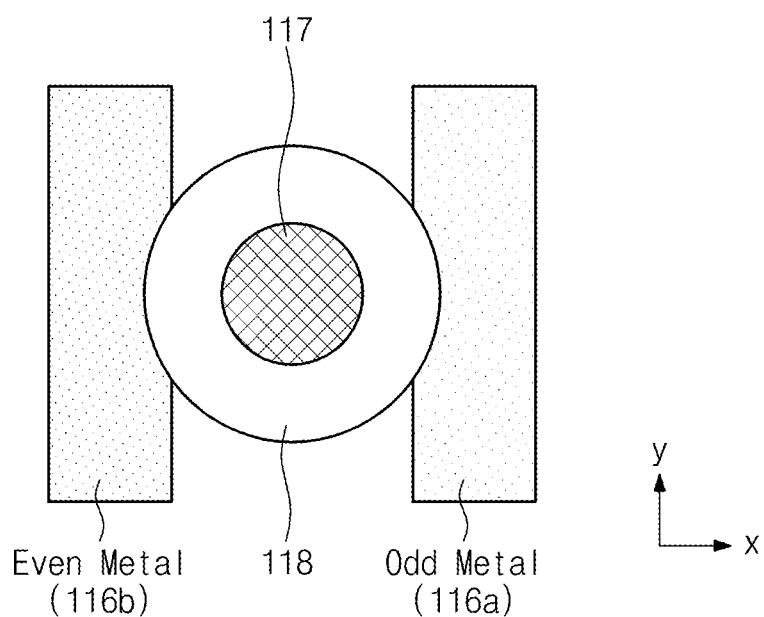
FIG. 13 is a cross-sectional view of a variable resistance memory cell formed in one layer of the memory cell array of FIG. 12.

FIG. 13 is a cross-sectional view of a variable resistance memory cell formed at one layer in FIG. 12 according to an embodiment of the inventive concept.

Referring to FIG. 13, a memory cell MC comprises a pillar 117 and 118 between a first metal 116a and a second metal 116b. A pillar penetrating in a direction (a z-axis direction) perpendicular to a substrate is formed between metal lines 116a and 116b forming a horizontal electrode. The pillar comprises a data storing film 118 and a vertical electrode 117 that are formed in a cylindrical shape. A variable resistance memory cell is formed by vertical electrode 117 connected to a bit line and metal lines 116a and 116b connected to a word line. Data storing film 118 is formed by etch and deposition processes in a vertical direction. Vertical electrode 117 is formed by a deposition process, for example, a PVD, CVD, or AVD process.

Figure 14:
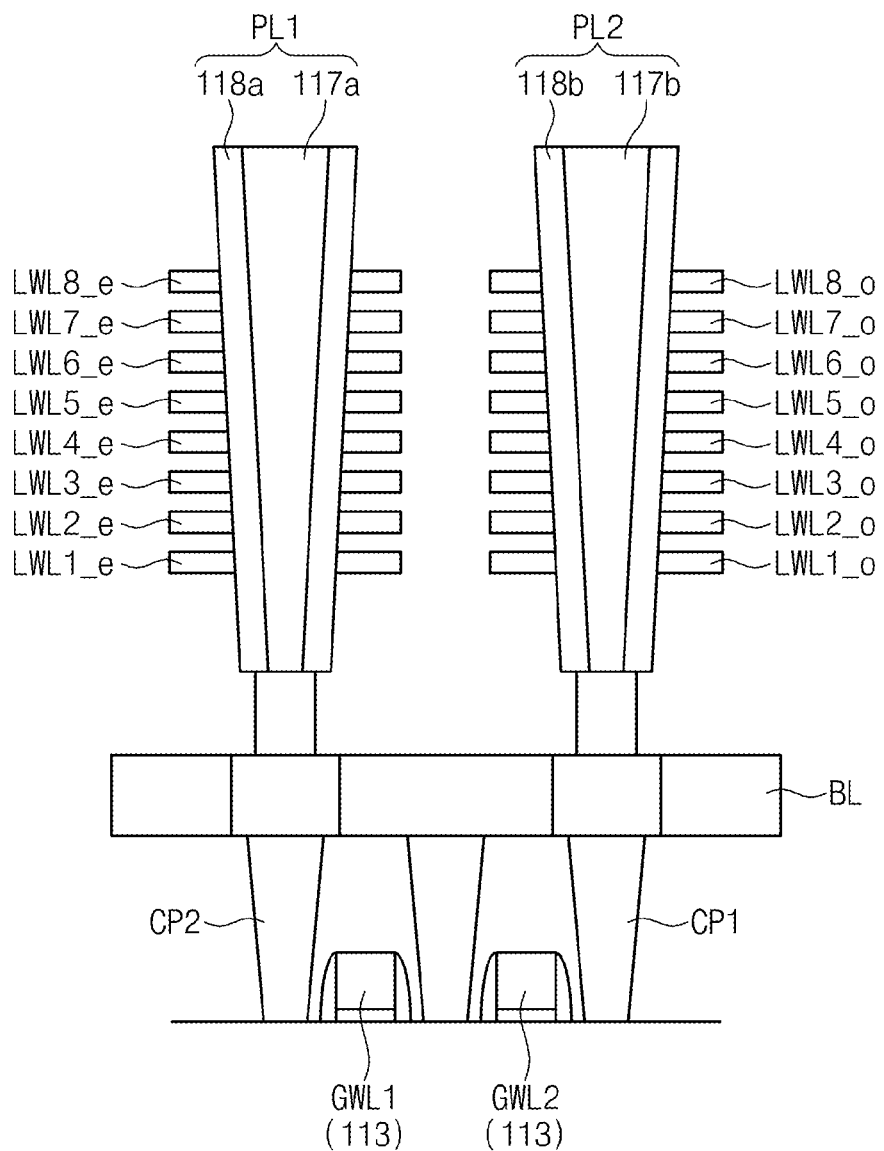
FIG. 14 is a cross-section view of the memory cell array of FIG. 12.

FIG. 14 is a cross-section view of memory cell array 110 of FIG. 12.

Referring to FIG. 14, memory cell array 110 comprises pillars PL1 and PL2 forming a vertical electrode and a variable resistance memory cell, multiple horizontal electrodes LWL1_e to LWL8_e and LWL1_o to LWL8_o stacked in a direction perpendicular to a substrate, bit lines connected to bit lines via doping regions, and global word lines GWL1 and GWL2 for providing a word line voltage to multiple horizontal electrodes.

Figure 15:
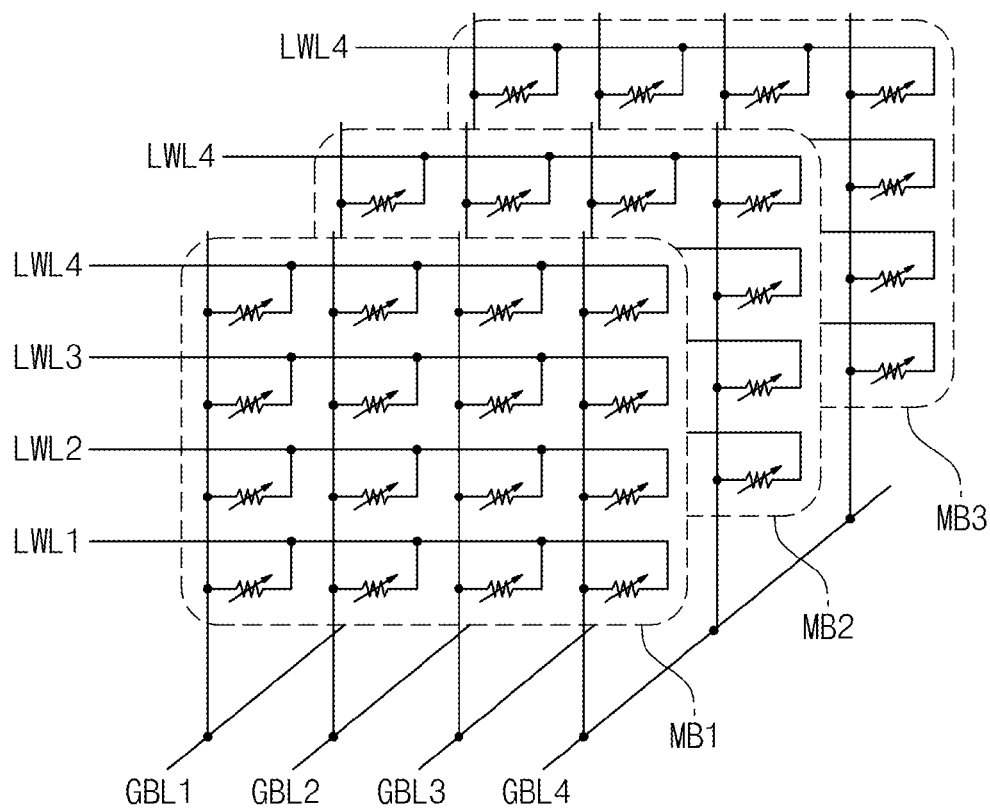
FIG. 15 is a circuit diagram of the memory cell array of FIG. 12.

FIG. 15 is a circuit diagram of memory cell array 110 of FIG. 12.

Referring to FIG. 15, memory cell array 110 comprises multiple memory blocks MB1 to MB3 that form one unit at an x-z plane.

Memory cell array 110 comprises multiple local bit lines extending in parallel in a z-axis direction and multiple local word lines LWL1 to LWL4 extending in parallel in a y-axis direction perpendicular to the z-axis direction. Although not shown in figures, memory blocks MB1 to MB3 are connected to different local word lines.

Local bit lines LBL11 to LBL43 formed by vertical channels of pillars are connected to global bit lines GBL1 to GBL4, respectively. Variable resistive memory cells of memory cell array 110 are connected to local word lines LWL1 to LWL4 or local bit lines LBL11 to LBL43. Variable resistive memory cells may be programmed or sensed by voltages applied to local word lines LWL1 to LWL4 or local bit lines LBL11 to LBL43.

Figure 16:
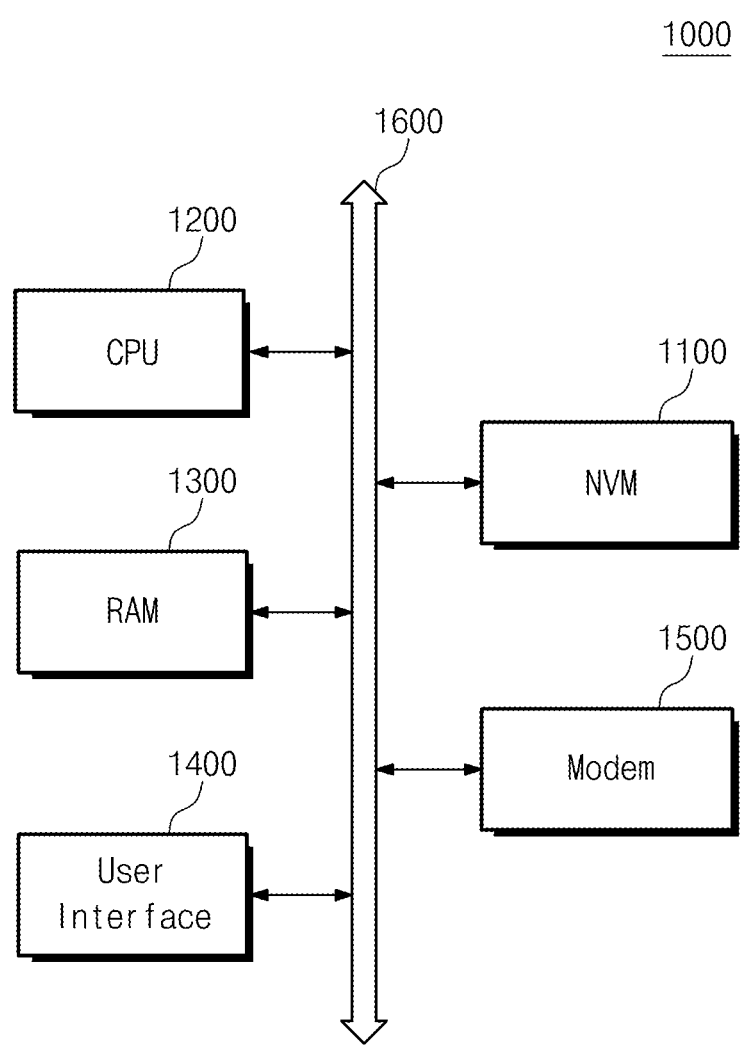
FIG. 16 is a block diagram illustrating a computing system including a nonvolatile memory device according to an embodiment of the inventive concept.

FIG. 16 is a block diagram of a computing system 1000 comprising a nonvolatile memory device according to an embodiment of the inventive concept.

Referring to FIG. 16, computing system 1000 comprises a nonvolatile memory device 1100, a microprocessor 1200, a RAM 1300, a user interface 1400, and a modem 1500 such as a baseband chipset, which are electrically connected to a system bus 1600. Nonvolatile memory device 1100 can be implemented by a variable resistance memory device such as that illustrated in FIG. 4.

Where computing system 1000 is a mobile device, it may further comprise a battery (not shown) as a power source. In addition, although not shown in FIG. 15, computing system 1000 may further comprise additional features such as an application chipset, a camera image processor (CIS), and a mobile DRAM, for example.

A resistive memory device may be packaged in any of various alternative package types, such as Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), and Wafer-Level Processed Stack Package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A variable resistance memory device, comprising:
   a cell array comprising variable resistance memory cells arranged in m rows and n columns, wherein each variable resistance memory cell comprises a bipolar resistance memory material having an asymmetric hysteresis characteristic; and
   a voltage generator configured to provide the cell array with a driving voltage determined according to the number of rows and the number of columns.

2. The variable resistance memory device of claim 1, wherein the variable resistance memory cells are formed without selection elements between word lines and bit lines.

3. The variable resistance memory device of claim 1, wherein the voltage generator supplies a program voltage to a word line of a selected memory cell in a program operation, the program voltage having a magnitude satisfying a condition of $Vrst \leq Vpgm < 2 \times Vrst$ or $Vrst \leq Vpgm < -(m+n-1)Vset$, wherein Vpgm represents the program voltage, Vrst represents a voltage at which a variable resistance memory cell transitions to a reset state from a set state, and Vset represents a voltage at which the variable resistance memory cell transitions from the reset state to the set state.

4. The variable resistance memory device of claim 3, wherein the voltage generator provides an inhibit voltage corresponding to half the program voltage to a word line of an unselected memory cell in the program operation.

5. The variable resistance memory device of claim 3, wherein the voltage generator supplies a sensing voltage to a word line of a selected memory cell in a read operation, the sensing voltage having a magnitude satisfying a condition of $-(m+n-1)|Vrst| \leq Vsen < Vset$ or $Vrst \leq Vsen < (m+n-1)|Vset|$.

6. The variable resistance memory device of claim 3, wherein in an erase operation, the voltage generator provides 0V to word lines of selected memory cells and an erase voltage to bit lines of the selected memory cells, wherein the erase voltage is greater than or equal to a voltage of $2 \times |Vrst|$.

7. A method performed in relation to a variable resistance memory device comprising a cell array, the method comprising:
   determining a level of an access voltage based on a number of rows or columns of the cell array; and
   supplying the access voltage having the determined level to the cell array.

8. The method of claim 7, wherein the cell array comprises a plurality of variable resistance memory cells connected between a plurality of word lines and a plurality of bit lines, wherein each of the plurality of variable resistance memory cells is connected to a corresponding word line and bit line without an intervening selection element.

9. The method of claim 8, wherein each variable resistance memory cell comprises a bipolar resistance memory material.

10. The method of claim 9, wherein the bipolar resistance memory material has an asymmetric hysteresis characteristic.

11. The method of claim 7, wherein the access voltage is a program voltage used to switch a resistance state of a variable resistance memory cell of the cell array into a reset state being a high resistance state, wherein the program voltage is greater than or equal to twice a reset voltage of the variable resistance memory cell, which is a negative voltage, and less than or equal to the reset voltage, and wherein the resistance state of the variable resistance memory cell transitions to the reset state in response to the reset voltage.

12. The method of claim 7, wherein the access voltage is a program voltage used to switch a resistance state of a variable resistance memory cell of the cell array into a reset state, wherein the program voltage is greater than $-(m+n-1)$ times a set voltage of the variable resistance memory cell and lower than a reset voltage of the variable resistance memory cell and a resistance state of the variable resistance memory cell transitions to a set state being a low resistance state in response to the set voltage, wherein m indicates the number of rows of the cell array and n indicates the number of columns of the cell array, wherein the resistance state of the variable resistance memory cell transitions to the reset state being a high resistance state in response to the reset voltage.

13. The method of claim 7, wherein the access voltage is an erase voltage used to switch a resistance state of a variable resistance memory cell of the cell array into a set state, the erase voltage being higher than a set voltage of the variable resistance memory cell or higher than twice an absolute value of a reset voltage of the variable resistance memory cell, wherein the resistance state of the variable resistance memory cell transitions to the set state being a low resistance state in response to the set voltage and to a reset state being a high resistance state in response to the reset voltage.

14. The method of claim 7, wherein the access voltage is a sensing voltage used to sense a resistance value of a variable resistance memory cell of the cell array, the sensing voltage is greater than $-(m+n-1)$ times an absolute value of a reset voltage of the variable resistance memory cell and lower than a set voltage of the variable resistance memory cell, wherein a resistance state of the variable resistance memory cell transitions to a high resistance state from a low resistance state in response to the reset voltage and to the low resistance state from the high resistance state in response to the set voltage, wherein m indicates the number of rows and n indicates the number of columns of the cell array.

15. The method of claim 7, wherein the access voltage is a sensing voltage used to sense a resistance value of a variable resistance memory cell of the cell array, the sensing voltage being higher than a reset voltage of the variable resistance memory cell and lower than $(m+n-1)$ times a set voltage of the variable resistance memory cell, wherein a resistance state of the variable resistance memory cell transitions to a high resistance state from a low resistance state in response to the reset voltage and to the low resistance state from the high resistance state in response to the set voltage, wherein m indicates the number of rows and n indicates the number of columns of the cell array.

16. A variable resistance memory device, comprising:
a cell array comprising variable resistance memory cells arranged in rows and columns connected to corresponding word lines and bit lines;
a voltage generator configured to control the variable resistance memory cells using operating voltages determined according to the number of rows and the number of columns, wherein
each of the variable resistance memory cells comprises a variable resistance storage element connected to a corresponding word line and a corresponding bit line without an intervening selection element.

17. The variable resistance memory device of claim 16, wherein the operating voltages include a program voltage, and a magnitude of the program voltage is determined according to an inequality $Vrst \leq Vpgm < 2 \times Vrst$ or $Vrst \leq Vpgm < -(m+n-1)Vset$, wherein m and n represent the number of rows and columns, respectively, Vpgm represents the program voltage, Vrst represents a voltage at which a variable resistance memory cell transitions to a reset state from a set state, and Vset represents a voltage at which the variable resistance memory cell transitions from the reset state to the set state.

18. The variable resistance memory device of claim 17, wherein the operating voltages include a program inhibit voltage corresponding to half the program voltage.

19. The variable resistance memory device of claim 16, wherein the operating voltages include a sensing voltage having a magnitude determined according to an inequality $-(m+n-1)|Vrst| \leq Vsen < Vset$ or $Vrst \leq Vsen < (m+n-1)|Vset|$, wherein m and n represent the number of rows and columns, respectively, Vrst represents a voltage at which a variable resistance memory cell transitions to a reset state from a set state and Vset represents a voltage at which the variable resistance memory cell transitions to the set state from the reset state.

20. The device of claim 16, wherein when one of the variable resistance memory cells that is addressed by a selected one of the word lines and a selected one of the bit lines is programmed to have a high resistance value, the voltage generator:
applies a programming voltage to the selected word line,
applies an inhibit voltage to all of the word lines other than the selected word line,
applies a voltage ground to the selected bit line, and
floats all of the bit lines other than the selected bit line so that a current does not flow through the entire bit line.

* * * * *